United States Patent [19]

Torres et al.

[11] Patent Number: 4,871,691

[45] Date of Patent: Oct. 3, 1989

[54] SELECTIVE DEPOSITION PROCESS OF A REFRACTORY METAL SILICIDE ONTO SILICON AREAS

[75] Inventors: Joaquim Torres, Saint Martin Le Vinoux; Roland Madar; Claude Bernard, both of Eybens; Jean-Francois Million-Brodaz, Chambery, all of France

[73] Assignee: Etat Francais Centre National de la Recherche Scientifique, France

[21] Appl. No.: 269,754

[22] Filed: Nov. 8, 1988

[30] Foreign Application Priority Data

Nov. 9, 1987 [FR] France ............................... 87 15885

[51] Int. Cl.$^4$ ...................... H01L 21/44; C23C 16/42
[52] U.S. Cl. .................................... 437/200; 437/245; 148/DIG. 147; 427/126.1
[58] Field of Search ........................ 437/200, 245, 192; 148/DIG. 147; 427/124, 126.1

[56] References Cited

U.S. PATENT DOCUMENTS

| | | | |
|---|---|---|---|
| 4,501,769 | 2/1985 | Hieber et al. | 437/200 |
| 4,568,565 | 2/1986 | Gupta et al. | 437/170 |
| 4,619,038 | 10/1986 | Pintchovski | 437/200 |
| 4,668,530 | 5/1987 | Reif et al. | 427/55 |

FOREIGN PATENT DOCUMENTS

| | | |
|---|---|---|
| 0090319 | 3/1983 | European Pat. Off. |
| 0245934 | 11/1987 | European Pat. Off. |
| 3211752 | 10/1983 | Fed. Rep. of Germany |
| 3439853 | 5/1985 | Fed. Rep. of Germany |
| 3516840 | 11/1985 | Fed. Rep. of Germany |
| 2589887 | 11/1985 | France |
| 0056574 | 4/1984 | Japan |
| 0109172 | 5/1988 | Japan |

OTHER PUBLICATIONS

Tedrow et al., "Low Pressure Chemical Vapor Deposition of Titanium Silicide", Appl. Phys. Lett., vol. 46, No. 2, pp. 189-191.

Hara et al., "Deposition and Properties of Plasma-Enhanced CVD Titanium Silicide", Proc.-Electrochem. Soc. 87-8, (Proc. Int. Conf. Chem. Vapor Deposition, 10th, 1987), pp. 867-876.

Million-Brodaz et al., "Thermodynamic and Experimental Studies of the APCVD of Titanium Disilicide", Vide, Couches Minces, vol. 42, No. 236, pp. 191-194.

Ilderem et al., "Optimized Deposition Parameters for Low Pressure Chemical Vapor Deposite Titanium Silicide", J. Electrochem. Soc., vol. 135, No. 10, pp. 2590-2596.

Ilderem et al., "Very Low Pressure Chemical Vapor Deposition Process for Selective Titanium Silicide Films", App. Phys. Lett., vol. 53, No. 8, pp. 687-689.

*Primary Examiner*—Brian E. Hearn
*Assistant Examiner*—M. Wilczewski
*Attorney, Agent, or Firm*—Lowe, Price, LeBlanc, Becker & Shur

[57] ABSTRACT

A selective deposition process of a refractory metal silicide onto the silicon apparent surfaces of a wafer partially coated with $SiO_2$, comprising the following steps: flowing in a cold-wall airtight chamber comprising said wafer a gaseous silane composite at a partial pressure $P_{Si_xH_y}$ and an halogenide of said metal at a partial pressure $P_{Me}$; heating the wafer to a first temperature (T1) for a first duration (t1), $P_{Si_xH_y}$ and $P_{Me}$ being chosen so as to allow a metal silicide deposition to be formed on the wafer, the silicon being overstoichiometric; and, heating the wafer to a second temperature (T2) lower than the first one for a second duration (t2), T2 being chosen as a function of $P_{Si_xH_y}$ and $P_{Me}$ so as to allow a stoichiometric metal silicide deposition to be formed on the wafer.

8 Claims, 2 Drawing Sheets

SELECTIVE DEPOSITION PROCESS OF A REFRACTORY METAL SILICIDE ONTO SILICON AREAS

BACKGROUND OF THE INVENTION

The instant invention relates to the manufacturing of semiconductor integrated circuits.

In the manufacturing processes of semiconductor integrated circuits, one of the steps usually provided for consists in establishing metal contacts or metal silicide contacts on the apparent silicon layers, the remaining part of the wafer being masked by silicon oxide.

More particularly, it has been proved advantageous to use a refractory metal and to provide for processes permitting to localize the formation of a metal silicide on the only places where the silicon is apparent.

U.S. Pat. No. 4,619,038 describes a process for the localized deposition onto a substrate of a silicide of a metal having a high melting point such as titanium. This patent indicates as an example that use can be made of a structure such as the one illustrated in FIG. 1 comprising a MOS transistor formed on a silicon substrate 1 within an area enclosed by a field oxide 2. This transistor comprises a drain region 3 and a source region 4 separated by a channel region covered with a gate comprising a thin oxide 5 coated with a polycristalline silicon layer 6 laterally insulaed by silicon oxide spacers 7. This patent proposes to position such a structure into a chamber comprising as a reactive gas a titanium halogenide and hydrogen. Thus, a titanium silicide 8 is formed, as shown in FIG. 2, on the apparent silicon surfaces. Since reactive gases do not contain any silicide, it is evident that silicide can be formed only from the silicon comprised within the areas 3, 4 and 6. Thus, a certain penetration of titanium silicide occurs into the silicon areas. This penetration presents a drawback because it reduces the thickness of the implanted silicon areas 3 and 4 and the thickness of the polycrystalline crystalline silicon area of gate 6. This makes it necessary to initially oversize those layers or may result in a breakdown. On the other hand, it will be noted that, according to this process, the depostion is carried out at a temperature of about 700° to 1,000° C., which may also constitute a drawback on account of the dopant redistributions and diffusions this is liable to entail.

Another drawback of the methods according to the prior art for locally forming the metal silicide is very schematically illustrated in relation with FIGS. 3A, 3B, 3C. As shown in FIG. 3A, when a silicon area is to be bared inside an oxide mask 11, some residues of silicon oxide 12 and/or a very thin layer of native silicon oxide unavoidably remain, for example having a thickness of a few molecules. If a depostion or a selective growth of a metal silicide is then carried out, this silicide is initially developed within the oxide-free nucleation areas, since this deposition is precisely carried out in circumstances when it is selective with respect to $SiO_2$. Therefore, nucleation areas 13 such as those illustrated in FIG. 3B are initially found. It has also been assumed in FIG. 3B that, simultaneously to the formation of the nucleation areas, a method permitting to eliminate the oxide areas 12 has been used. As a result, as shown in FIG. 3C, once the growth or the deposition is completed, the upper surface (and possibly the lower surface) of the silicon layer presents roughnesses, which consitutes a drawback for the subsequent processes. This drawback, though not mentioned in U.S. Pat. No. 4,619,038, unavoidably appears.

U.S. Pat. No. 4,501,769 describes a selective deposition process of a silicide of a refractory metal such as molybdenum, tungsten or tantalum onto silicon.

This patent proposes to use as a reactive gas a composite comprising a metal halogenide, hydrogen or an hydrogen halogenide and a silicon hydrogenated halogenide, that is, for example a composite $TaCl_5$, $H_2$ or HCl, and $SiH_2Cl_2$. However, the problems inherent to the consumption of silicon on which it is desirable to form the metal silicide are not entirely solved by this process. Indeed, the preferential temperatures that are mentioned are close to 850° C. and, at those temperatures, a consumption of the substrate silicon unavoidably occurs. Even though, as suggested by the claims of this patent, it was possible to operate at lower temperatures, the problem inherent to the silicon consumption might be solved but the problem caused by the initial deoxidation of the native silicon oxide and of the resulting roughnesses would still remain unsolved.

SUMMARY OF THE INVENTION

Therefore, an object of the instant invention is to provide for a new process for metal silicide deposition palliating the two hereinabove mentioned drawbacks.

In order to attain those objects and others, the instant invention provides for a process for the selective deposition of a refractory metal silicide onto the apparent silicon surfaces of a wafer coated on the other side with $SiO_2$, comprising the steps consisting in flowing into a cold-wall airtight chamber containing said wafer a gaseous silane composite at a first partial pressure $P_{Si_xH_y}$ and an halogenide of said metal at a second partial pressure $P_{Me}$; heating the wafer to a first temperature T1 for a first duration, the values T1, $P_{Si_xH_y}$ and $P_{Me}$ being chosen so as to allow a metal silicide deposition to be formed onto the wafer, the silicon being overstoichiometric; and heating the wafer to a second temperature T2 lower than the first one for a second duration, T2 being chosen as a function of $P_{Si_xH_y}$ and $P_{Me}$ so as to allow a deposition of stoichiometric metal silicide to be formed onto the wafer.

According to an embodiment of the instant invention, the metal is titanium.

According to an embodiment of the instant invention, the partial pressures $P_{Si_x}H_y$ and $P_{Me}$ are chose so as to be located within the area specifically determined in the phase charts illustrated in FIG. 4.

According to an embodiment of the instant invention, the duration t1 is comprised between 1 and 30 seconds, the duration t2 between ½ and a few minutes, the temperature T1 between 700° and 1,000° C., and the temperature T2 between 450° and 700° C.

According to an embodiment of the instant invention, the reactive gaseous medium is submitteed to an ultraviolet radiation during the process.

According to an embodiment of the instant invention, in addition to the active gases, a neutral gas such as argon and possibly hydrogen is allowed to flow inside the chamber.

Thus, the invention solves both hereinabove mentioned problems. During the first phase at the highest temperature, a deoxidation of the native or remaining silicon oxide is carried out and, during the second phase, owing to the low temperature in the chamber, there is no substantial consumption of the underlying silicon.

BRIEF DESCRIPTION OF THE DRAWINGS

Those objects, features, advantages and others of the instant invention will clearly appear from the following detailed description of preferred embodiments, in connection with the attached drawings, wherein.

DETAILED DESCRIPTION OF THE DRAWINGS

The instant invention is based on the systematic analysis of the phase chart relative to the depositions produced by a mixture of a metal halogenide, for example a titanium halogenide such as a titanium chloride ($TiCl_4$), and silane ($SiH_4$ or $Si_2H_6$) (and not an halogenated silane such as $SiH_2Cl_2$ as it was the case in the prior art). The figure shows in the X-axis the partial pressure of silane ($P_{SIH4}$) and in the Y-axis the partial pressure of the metal halogenide ($P_{Me}$). Those pressures are written in pascals.

For a given temperature, T1, the inventors have observed in that representation of partial pressures that it was possible to differentiate more particularly three areas delimited by boundary lines L1 and M1. Between those boundary lines L1 and M1, within an area A, a stoichiometric deposition of metal silicide occurs (for example for Ti, $TiSi_2$). For partial pressures corresponding to an area C located on the left of the boundary line L1, a substoichiometric metal silicide with respect to silicon (for example for titanium a composite of TiSi and of $TiSi_2$ is obtained). On the right of the boundary line M1, in an area B, an overstoichiometric metal silicide, that is, a composite of metal silicide and silicon is deposited (for example, for Ti, $TiSi_2$ + Si is obtained).

Figure 1:
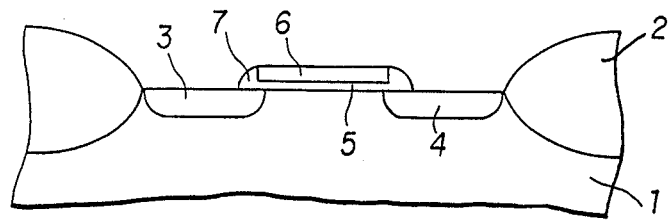
FIGS. 1 and 2 illustrate a process according to the prior art.
Figure 2:
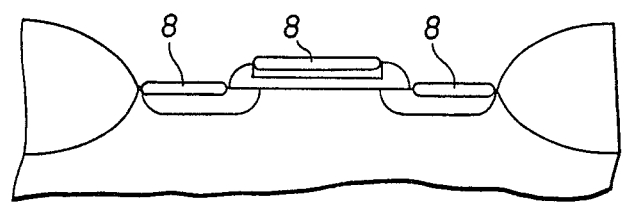
Figure 3A:
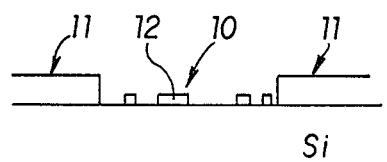
FIGS. 3A, 3B, 3C illustrate a conventional drawback of the processes according to the prior art.
Figure 3B:
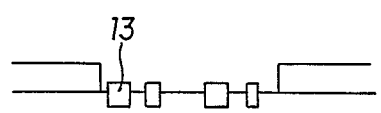
Figure 3C:
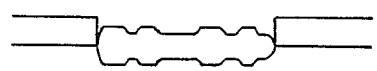
Figure 4:
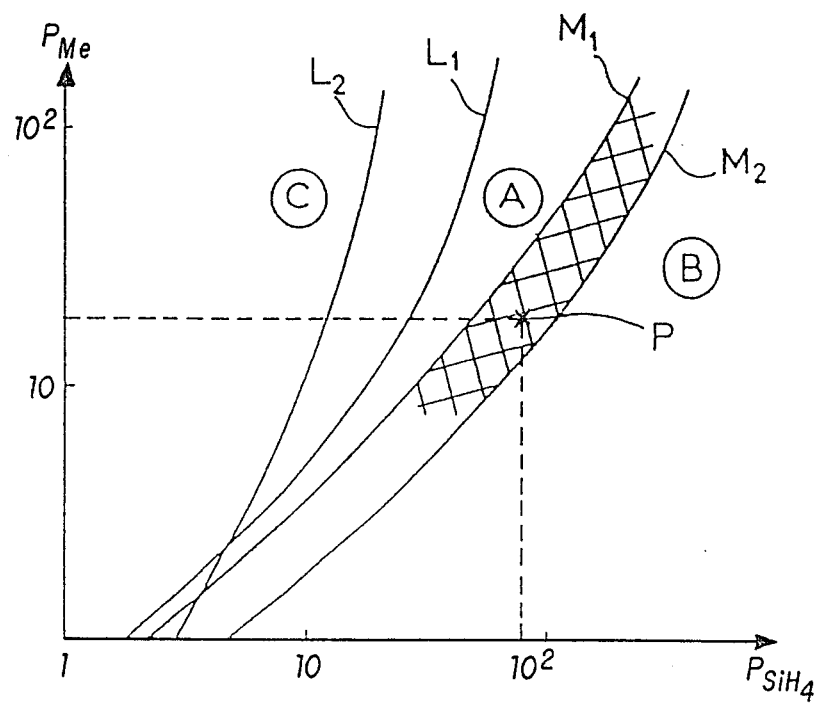
FIG. 4 shows a phase chart for the various pressures and temperatures of the gas flowing in a reaction chamber implementing the process according to the instant invention.

According to a discovery made by the inventors, those boundary lines L and M vary as a function of the temperature in the way shown in FIG. 4, where boundary lines L1 and M1 for a first temperature T1, for example of about 700° to 1,000° C., and boundary lines L2 and M2 for a second, lower temperature T2, for example of about 450° to 700° C., are shown.

More particularly, the inventors have discovered that for a given compound of the reactive gas composite located in the cross-hatched area of the figure, for a first temperature T1, the operating conditions correspond to the area B of metal silicide plus silicon deposition and, for a second lower temperature T2, to the area A of stoichiometric metal silicide deposition.

From this observation, it is proposed, according to the instant invention, to position the wafers to be processed comprising regions of apparent silicon and regions coated with silicon oxide onto a heating stand at an adjustable temperature into a cold-wall reactor through which a mixture of $SiH_4$, metal halogenide and possibly carrier gases flows. The mixture is determined so that the operating point is the point P shown in Fig. 4.

A high-temperature (T1) process is then implemented for which the point P is located in area B for obtaining a silicon overstoichiometric mixture. As a result, the excess silicon is combined with the silicon oxide present on the wafer and in particular at the places where the native silicon oxide is present for eliminating this silicon oxide through the reaction $SiO_2 + Si \rightarrow 2SiO$, the latter being a gaseous material and being eliminated. This first step is continued for a sufficient duration so as to eliminate all the native or residual $SiO_2$ liable to exist in the apparent silicon areas, for example for a duration of about 1 to 30 seconds.

Then the temperature is lowered to a value T2 for which the point P is located in the area A for a second duration of half a minute to a few minutes and the stoichiometric metal silicide is deposited at a lower temperature.

In a preferred embodiment, one has used as a reactive gas $SiH_4$ and $TiCl_4$ in the presence of carrier gases constituted by argon and hydrogen, with partial pressures written in pascals of $0.08 \times 10^5$ for hydrogen, $0.9 \times 10^5$ for argon, $4.4 \times 10^2$ for silane and $1 \times 10^2$ for $TiCl_4$. First, a deposition of $TiSi_2$ Si has been carried out for 10 seconds at a temperature of 900° C. During this first step, a silicon deoxidation and a deposition of a layer of $TiSi_2$ having a thickness of about 10 nm have been formed. Then, the temperature has been lowered to 600° C. and maintained for a duration of 2 minutes so as to obtain a deposition of $TiSi_2$ of 100 nm.

It will be noted that according to an advantage of the instant invention, the second deposition period of $TiSi_2$ occurs in such circumstances that some stoichiometric $TiSi_2$ appears, which is therefore quite unlikely to combine with the substrate silicon. Moreover, this combination probability is still reduced because of the low temperature. Indeed, this combination entirely disappears when the temperature is below 550° C. and substantially decreases from a temperature of about 700° C. The double advantage of the instant invention could not then be obtained with the processes according to the prior art wherein, even though it can be admitted that some stoichiometric $TiSi_2$ was present in the mixture, the processing temperatures were necessarily higher than about 800° C. and a consumption of silicon on which the deposition is carried out unavoidably occurred.

It will be also noted that any silane (for example $SiH_4$) is less stable than any silane halogenide (for example $SiH_2Cl_2$), which permits to lower the temperature T2 during the second deposition step. This effect is increased by using silane composites still less stable (for example $Si_2H_6$).

It will be noted that according to an advantage of the instant invention, it is possible to obtain an additional activation of the deposition when operating in the presence of an ultraviolet radiation. This permits to further reduce the temperatures or, for a given temperature, to accelerate the deposition rates.

On the other hand, it will be noted that it is essential to make the right choice as regards the partial pressures of the reactive gases and the deposition temperature so as to obtain as quick a deposition as possible. It has further been observed that this deposition rate is accelerated as a consequence of an increase of the net pressure in the chamber inherent to the presence of a neutral gas possibly added with hydrogen.

We claim:

1. A selective deposition method of a refractory metal silicide onto the apparent silicon surfaces of a wafer partially coated with $SiO_2$, comprising the following steps:

flowing inside a cold-wall airtight chamber comprising said wafer a gaseous silane composite at a first partial pressure $P_{Si_xH_y}$ and an halogenide of said metal at a second partial pressure $P_{Me}$;

heating the wafer to a first temperature (T1) for a first duration (t1), T1, $P_{Si_xH_y}$ and $P_{Me}$ being chosen so as to allow a metal silicide deposition to be formed on the wafer, silicon being overstoichiometric; and heating the wafer to a second temperature (T2) lower than the first one for a second duration (t2), T2 being chosen as a function of $P_{Si_xH_y}$ and $P_{Me}$ so as to allow a stoichiometric metal silicide deposition.

2. A silicide selective deposition process according to claim 1, wherein the metal is titanium.

3. A silicide selective deposition process according to claim 1, wherein the partial pressures $P_{Si_x}H_y$ and $P_{Me}$ are chosen so as to be located within a predetermined region of the phase charts (FIG. 4).

4. A silicide selective deposition process according to claim 1, wherein the first duration (t1) is comprised between 1 and 30 seconds, the second duration (t2) between 1/2 and a few minutes, the first temperature (T1) between 700° and 1,000° C., and the second temperature (T2) between 450° and 700° C.

5. A silicide selective deposition process according to claim 1, wherein the reactive gaseous medium is submitted to an ultraviolet radiation during the process.

6. A silicide selective deposition process, wherein, in addition to the active gases mentioned in claim 1, a neutral gas such as argon and possibly hydrogen is allowed to flow in the chamber.

7. A silicide selective deposition process according to claim 1, wherein said gaseous silane composite is $SiH_4$.

8. A silicide selective deposition process according to claim 1, wherein said gaseous silane composite is $Si_2H_6$.

* * * * *